(12) United States Patent
Nakamura et al.

(10) Patent No.: US 6,735,074 B2
(45) Date of Patent: May 11, 2004

(54) CHIP CAPACITOR

(75) Inventors: Ryuji Nakamura, Kyoto (JP);
Yoshihito Suizu, Yamaguchi (JP);
Morihiro Fukuda, Yamaguchi (JP);
Sunao Matsunaga, Yamaguchi (JP);
Takeshi Shoji, Yamaguchi (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/182,825

(22) PCT Filed: Jan. 31, 2001

(86) PCT No.: PCT/JP01/00637
§ 371 (c)(1),
(2), (4) Date: Nov. 4, 2002

(87) PCT Pub. No.: WO01/57893
PCT Pub. Date: Aug. 9, 2001

(65) Prior Publication Data
US 2003/0123217 A1 Jul. 3, 2003

(30) Foreign Application Priority Data
Feb. 3, 2000 (JP) ........................... 2000-025938
Jul. 11, 2000 (JP) ........................... 2000-209411

(51) Int. Cl.$^7$ .............................................. H01G 4/228
(52) U.S. Cl. .................................... 361/520; 361/538
(58) Field of Search ................. 361/512–519, 361/525–529, 802, 808, 809, 810, 811, 820, 821

(56) References Cited

U.S. PATENT DOCUMENTS 5,420,748 A * 5/1995 Ryu ........................... 361/537
5,880,926 A * 3/1999 Nishino et al. ............. 361/517

FOREIGN PATENT DOCUMENTS

| JP | 60-148105 | 8/1985 |
|---|---|---|
| JP | 61-156224 | 9/1986 |
| JP | 5-226188 | 9/1993 |
| JP | 9-162077 | 6/1997 |
| JP | 9-190952 | 7/1997 |
| JP | 10-64756 | 3/1998 |
| JP | 11-233384 | 8/1999 |
| JP | 11-286493 | 10/1999 |
| JP | 2000-12384 | 1/2000 |

* cited by examiner

Primary Examiner—Dean A. Reichard
Assistant Examiner—Eric Thomas
(74) Attorney, Agent, or Firm—Wenderoth, Lind & Ponack, L.L.P.

(57) ABSTRACT

An aluminum electrolytic chip capacitor having excellent resistance against vibrations is disclosed. The capacitor is free from breakage of soldered portions or lead wires due to the vibrations upon being mounted on a board. The capacitor includes a metal case accommodating a capacitor element and having its open end sealed with a sealing member, and an insulated terminal plate mounted on the case. The case is provided with an annular shrink portion at the sealing of the open end. The terminal plate includes wall portions disposed at positions other than on a line of the lead wire bending direction of the periphery of the terminal plate. The wall portions cover at least the shrink portion. Inner surfaces of the wall portions abut the periphery of the case, thereby holding the case.

10 Claims, 12 Drawing Sheets

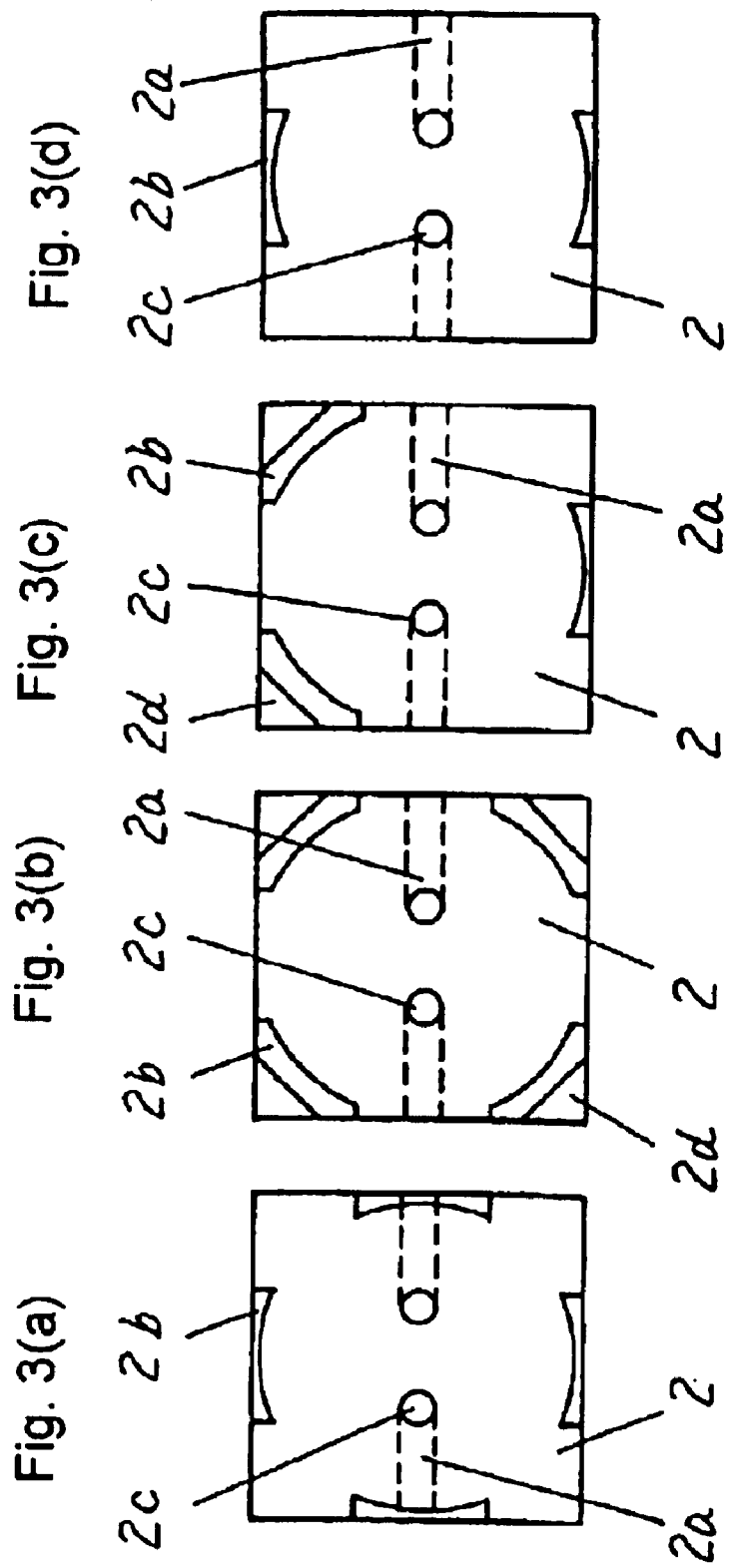

Fig. 9
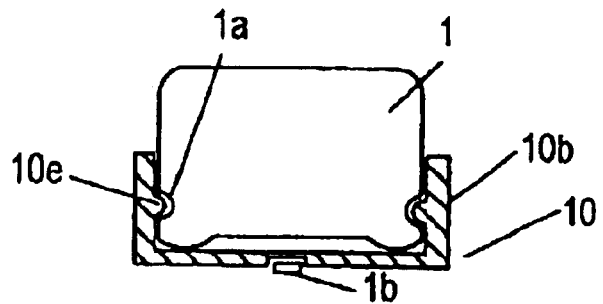
Fig. 10(a)　　　　Fig. 10(b)
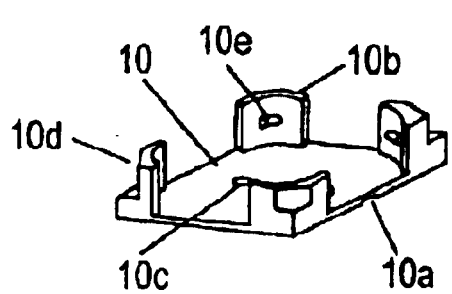 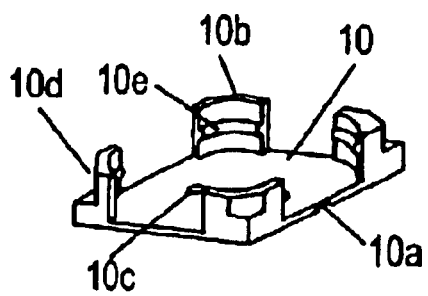
Fig. 11(a)　　　　Fig. 11(b)
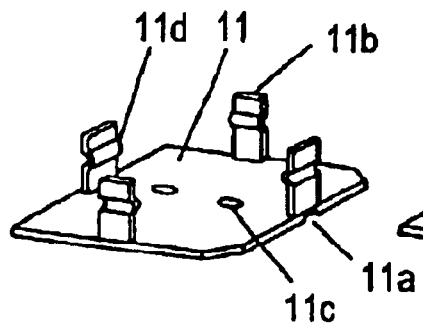 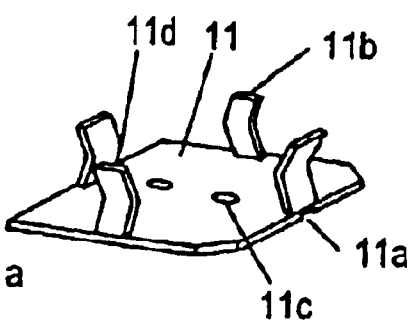

CHIP CAPACITOR

TECHNICAL FIELD

The present invention relates to a chip capacitor required to have a large vibration resistance, and particularly to an aluminum electrolytic chip capacitor to be mounted on a board as a surface-mounted capacitor.

BACKGROUND ART

FIGS. 16(*a*) and 16(*b*) are a front sectional view and a side sectional view of a conventional aluminum electrolytic chip capacitor, respectively. Aluminum electrolytic chip capacitor 21 (hereinafter called capacitor 21) includes a capacitor element 23, an open-bottomed cylindrical metal case 24 in which the element 23 and electrolyte for driving are accommodated, and a sealing member 25 for sealing the open end of case 24. The capacitor element 23 is formed by winding anode foil and cathode foil (not shown) with an anode lead wire 22*a* and a cathode lead wire 22*b* connected thereto, respectively, with a separator disposed between them. A shrink portion (reduced-diameter portion) 24*a* is formed at sealing of the case 24.

An insulated terminal plate 26 is disposed so as to abut the open end side of case 24, and its outer surface (a bottom of the figure) has holes 26*a* and groove portions 26*b*. Through the holes 26*a*, the lead wires 22*a* and 22*b* led out of capacitor element 23 pass, and in the groove portions 26*b*, the lead wires 22*a*, 22*b* bent perpendicularly are placed. The bent portions of lead wires 22*a*, 22*b* are finished flat. In this manner, the capacitor 21 is mounted on a surface of a board (not shown).

After the conventional capacitor is mounted on the board, when a strong stress of vibration is applied thereto in the Y direction perpendicular to the X direction, i.e., the direction of connecting the lead wires 22*a* and 22*b* as shown in FIG. 17, the capacitor 21 vibrates like a pendulum since it is connected to the board only at two portions of the lead wires 22*a* and 22*b*. Accordingly, soldered portions of the lead wires 22*a* and 22*b* connected to the board are peeled off, which may cause breakage of the lead wires.

Another conventional capacitor includes an insulated terminal plate of housing-like shape surrounding a capacitor body with lead wires connected thereto. In this technology, it is necessary to make the outer diameter of the body substantially identical to the inner diameter of a housing portion of the terminal plate in order to improve the vibration resistance. Therefore, it is difficult to mount the capacitor body in the housing portion.

Japanese Patent Laid-Open No.9-162077 discloses a support portion that rises and extends from a periphery of an insulated terminal plate, and a projection disposed at the support portion which fits in a shrink groove portion of a capacitor. This document further discloses a capacitor including a support portion split by notches, and a capacitor including a cylindrical support portion made of resin having elasticity unitarily formed with an insulated terminal plate. These capacitors, since their support portions have annular shapes, have their capacitor bodies mounted. Since the support portions are formed only up to the shrink groove portions, these capacitors cannot stand sufficiently against vibrations in consideration of mounting in, for example, automobiles.

As shown in FIG. 18, when being bent along the groove portion 26*b* disposed in the insulated terminal plate 26, the lead wires 22*a* and 22*b* are bent at acute angles only at one portion of each hole 26*a*. Therefore, the lead wires 22*a* and 22*b*, once bent and placed in the groove portions 26*b*, tend to return to their original positions due to a spring-back effect of the bent portions, and thereby generate a float t. The float t lowers soldering strength when a thin solder is applied.

Further, as shown in FIG. 19, in a capacitor including a dummy terminal 28 disposed on the outer surface (soldering surface or bottom surface) of the insulated terminal plate 27, the above problem is particularly remarkable. In the worst case, the solder does not contact with the dummy terminal 28. This may lead particularly to a serious problem since a thinner solder has been used recently.

In order to solve such problem, the lead wires 22*a* are 22*b* are bent with stronger forces, or the groove portions 27*a* in the insulated terminal plate 27 are formed deeper, thereby coping with the spring-back effect. However, such measure may invite a problem that the lead wires 22*a* and 22*b* cannot be soldered since they remain deep in the groove portions 27*a*.

DISCLOSURE OF THE INVENTION

An aluminum electrolytic chip capacitor is easily mounted, has an excellent vibration resistance, and can be soldered reliably even if a lead wire is positioned deeply in a groove portion formed in an insulated terminal plate.

The capacitor includes a capacitor element including a lead wire for leading to the exterior, a metal case for accommodating the capacitor element, a sealing member to seal an open end of the metal case, and an insulated terminal plate disposed so as to abut the sealing member. The metal case has a shrink portion of annular shape formed at the sealing. The capacitor further includes a wall portion disposed at a position other than on a line in a lead wire bending direction of a periphery of the insulated terminal plate. The wall portion is equal to or higher than the height of the shrink portion, and has its inner surface abut and hold the periphery of the metal case.

The capacitor, upon being mounted on a board, stands strong against vibrations given in all directions including a direction crossing the lead wire bending direction, thereby assuring excellent reliability.

BRIEF DESCRIPTION OF THE DRAWINGS

FIGS. 3(*a*) to 3(*d*) are plan views of other insulated terminal plates of the capacitor according to embodiment 1.

FIG. 4(*b*) is an enlarged view of an essential portion of a capacitor according to embodiment 2.

FIG. 9 is a sectional view of an aluminum electrolytic chip capacitor according to exemplary embodiment 5 of the invention.

FIG. 10(*a*) is a perspective view of an insulated terminal plate provided with a projection partially on an inner surface of a wall portion of the capacitor according to embodiment 5.

FIG. 10(*b*) is a perspective view of an insulated terminal plate provided with a projection entirely on the inner surface of the wall portion of the capacitor according to embodiment 5.

FIGS. 11(*a*) and 11(*b*) are perspective views of an insulated terminal plate of an aluminum electrolytic chip capacitor according to exemplary embodiment 6 of the invention.

FIG. 16(*b*) is a side sectional view of the conventional capacitor.

DETAILED DESCRIPTION OF PREFERRED EMBODIMENTS (Embodiment 1)

Figure 1:
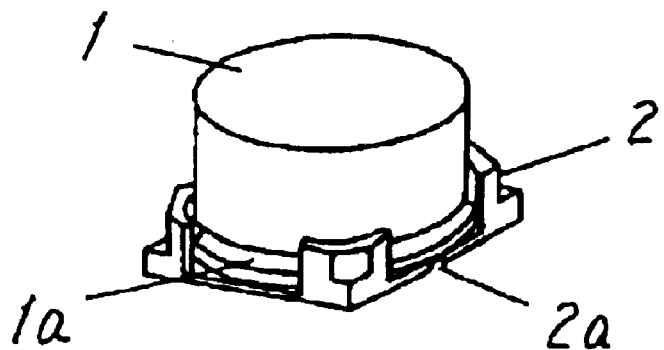
FIG. 1 is a perspective view of an aluminum electrolytic chip capacitor according to exemplary embodiment 1 of the present invention.
Figure 2:
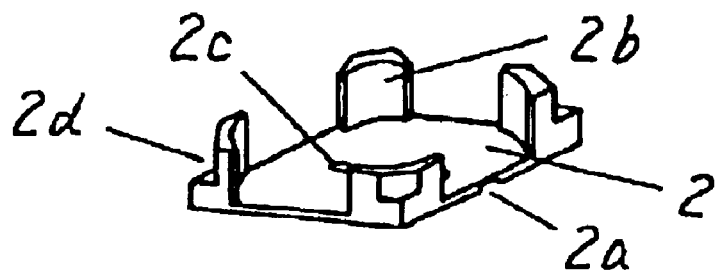
FIG. 2 is a perspective view of an insulated terminal plate of the capacitor according to embodiment 1.

FIG. 1 is a perspective view of an aluminum electrolytic chip capacitor (hereinafter called capacitor) in exemplary embodiment 1 of the present invention. FIG. 2 is a perspective view of an insulated terminal plate of the capacitor. FIGS. 3(*a*) to 3(*d*) are plan views of other insulated terminal plates. A metal case 1 accommodates a capacitor element together with an electrolyte for driving. An open end of the case 1 is sealed with a sealing member (not shown). The capacitor element is formed by winding anode foil and cathode foil with anode lead wire and cathode lead wire for external leading (not shown) connected thereto, respectively, with a separator disposed between them. A shrink portion (reduced-diameter portion) 1*a* is formed by shrinking the case 1 at the sealing area thereof.

An insulated terminal plate 2 is disposed so as to abut the sealing member, and its outer surface (a bottom in the figure) has a hole 2*c* through which each of a pair lead wires (not shown) led out of the capacitor element passes, and a groove portion 2*a* in which the lead wire bent perpendicularly is placed. This configuration has the capacitor mounted on a surface of a board. The lead wires are placed in the groove portions 2*a* so as to be substantially flush with the outer surface, and soldered as terminals when the capacitor is mounted on the board.

A terminal plate 2 has a square shape, and at its corners, plural wall portions 2*b* having their inner surfaces abut and hold a periphery of the case 1 are provided. Each wall portion 2*b* is higher than a height covering the shrink portion 1*a*, and the height is preferably at least ½ of the height of the metal case 1. The terminal plate 2 is unitarily formed with the wall portions made of insulating resin so that a size between the inner surfaces of opposing wall portions 2*b* is a little smaller than the outer diameter of the metal case 1. This arrangement enables the terminal plate 2 to precisely hold the periphery of the case 1, and therefore, suppresses excessive vibrations even when strong vibration is applied in a direction crossing the lead wire bending direction to the capacitor mounted on a board. Accordingly, the capacitor assures excellent vibration resistance and high reliability.

Possible positions of the wall portions 2*b* of the terminal plate 2 are shown in FIGS. 3(*a*) to 3(*d*).

FIG. 3(*a*) shows a wall portion 2*b* at the middle of each side of the square terminal plate 2. The four wall portions 2*b* precisely hold the case 1. A groove portion 2*a* is formed on the surface opposite to the wall portion 2*b* in order to accommodate each lead wire. Each lead wire passes through a hole 2*c*.

FIG. 3(*b*) shows a wall portion 2*b* at each corner of the square terminal plate 2. The four wall portions 2*b* precisely hold the case 1, and this arrangement improves strength of the wall portion 2*b* by increasing the thickness of the portion. If it is too thick, the wall portion 2*b* has reduced elasticity, and the metal case 1 cannot thus be smoothly fitted on the portion, thus making the capacitor element difficult to mount. However, as shown in FIG. 2, this problem can be solved by providing a notch 2*d* at the outer periphery of the wall portion 2*b*.

FIG. 3(*c*) shows the wall portions 2*b* at three portions in total, that is, at two corners which are ends of the lead wire bending direction of the square terminal plate 2 and at the middle of the opposite side. The three wall portions 2*b* precisely hold the case 1.

FIG. 3(*d*) shows a pair of wall portions 2*b* at positions other than on a line in the lead wire bending direction at the side of the square terminal plate 2. Even when strong vibration is applied in a direction crossing the lead wire bending direction, which tends to cause the greatest damage, the wall portions 2*b* precisely hold the case 1.

(Embodiment 2)

Figure 4A:
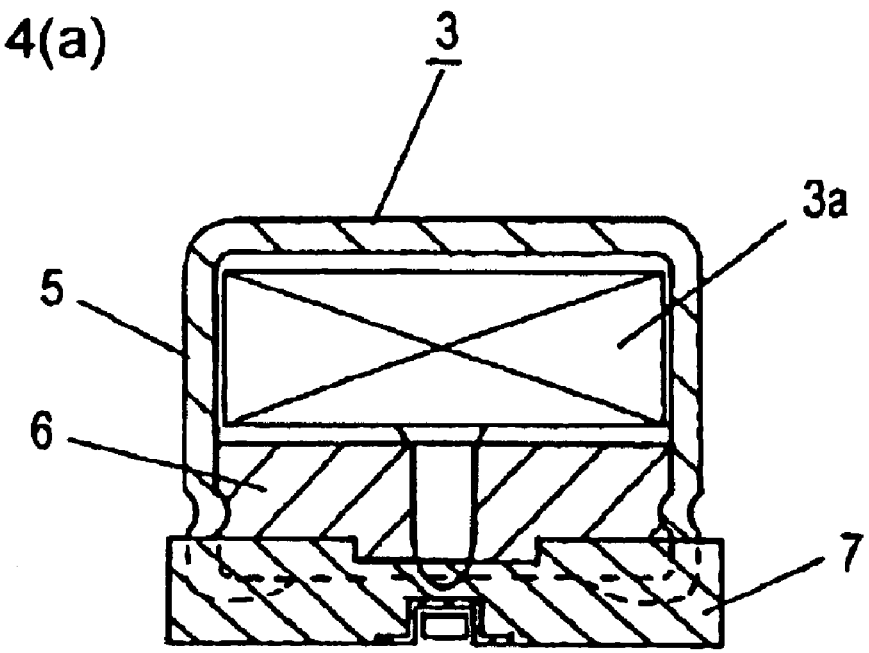
FIG. 4(*a*) is a sectional view of an aluminum electrolytic chip capacitor according to exemplary embodiment 2 of the invention.
Figure 4B:
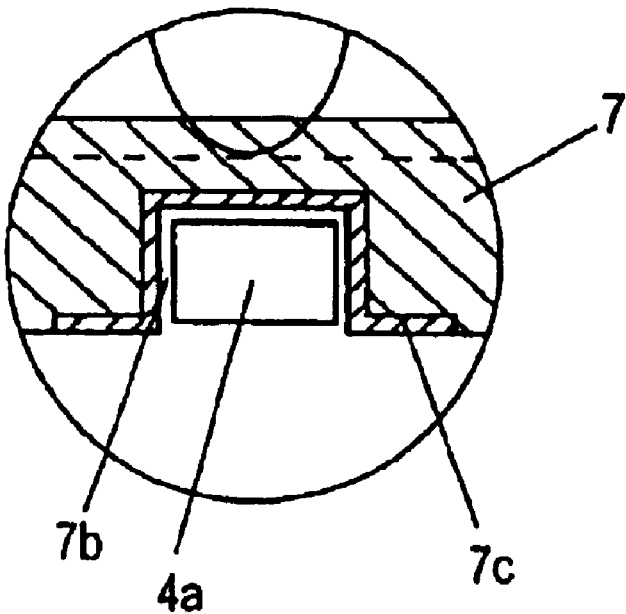
Figure 5:
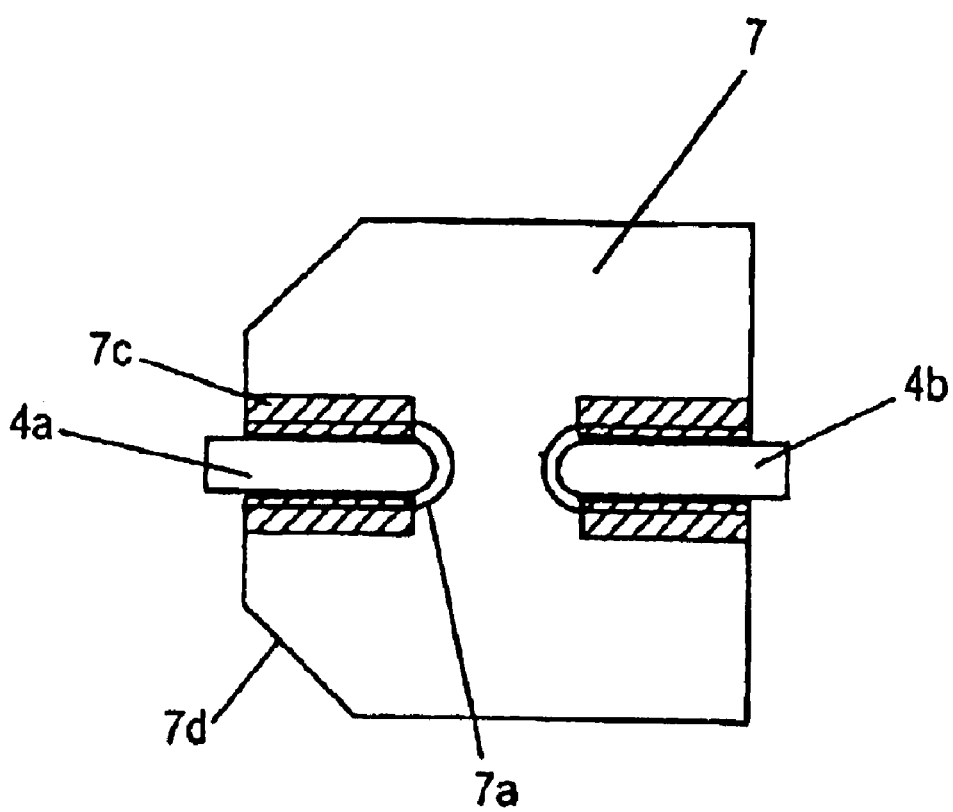
FIG. 5 is a bottom view of the capacitor according to embodiment 2.

FIGS. 4(*a*) and 4(*b*) are a front sectional view and an enlarged view of an essential portion of a capacitor according to exemplary embodiment 2 of the present invention, respectively. FIG. 5 is a bottom view of it. The capacitor 3 includes a capacitor element 3*a*, an open-bottomed cylindrical metal case 5 accommodating the element 3*a* together with electrolyte for driving, and sealing member 6 for sealing the open end of the case 5. The capacitor element 3*a* is formed by winding anode foil and cathode foil (not shown) with anode lead wire 4*a* and cathode lead wire 4*b* connected thereto, respectively, with a separator disposed between them. Respective end portions (bent portions described later) of the anode lead wire 4*a* and cathode lead wire 4*b* are finished flat.

An insulated terminal plate 7 is disposed so as to abut the open end of metal case 5, and its outer surface (a bottom in the figure) has a hole 7*a* through which each of a pair of lead wires 4*a* and 4*b* led out of the capacitor element 3*a* passes, and a groove portion 7*b* in which each of the lead wires 4*a* and 4*b* passing through the hole 7*a* and bent perpendicularly is placed. This arrangement allows the capacitor 3 to be mounted on a board (not shown). A metal portion 7c is disposed on the outer surface of the groove portion 7b and on a part of the outer surface of terminal plate 7 connected to the portion. The metal portion 7c may preferably be made of a metal sheet or a metal-plated coat. The groove portions 7b having the metal portions 7c accommodates the bent lead wires 4a and 4b.

Even if each of the lead wires 4a and 4b is placed deeply in the groove portion 7b when the capacitor 3 is soldered and mounted on a board, the solder contacts with the metal portion 7c, thereby allowing the capacitor 3 to be soldered. As a result, the lead wires 4a and 4b are securely soldered. The groove portion 7b may be formed more deeply in consideration of a spring-back effect of the lead wires 4a and 4b, and this suppresses floating of the lead wires and improves their soldering reliability.

The metal portion 7c may be disposed only on a part of an outer surface of the insulated terminal plate connecting to the outer surface of the groove portion 7b, and may be formed on the outer surface of the groove portion 7b and a part of the outer surface of the terminal plate 7 connected to the portion 7b. The portion 7c may be made of a metal-plated coat or a metal sheet according to, for example, a shape and size of the terminal plate 7 or a cost.

The terminal plate 7 is provided with chamfered portions 7d at its two corners which are located on one of its sides crossing the direction of the groove portion 7b. Predetermining that either one of the anode lead wire 4a and cathode lead wire 4b at the side where the chamfered portion 7d is disposed allows anode and cathode to be identified from an appearance of the mounted capacitor 3.

(Embodiment 3)

Figure 6:
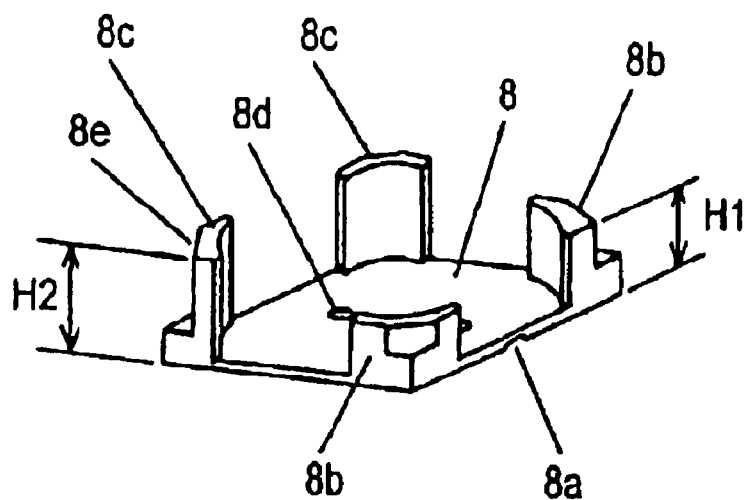
FIG. 6 is a perspective view of an insulated terminal plate of an aluminum electrolytic chip capacitor according to exemplary embodiment 3 of the invention.

FIG. 6 is a perspective view of an insulated terminal plate of a capacitor according to exemplary embodiment 3 of the present invention. Similarly to embodiment 1, insulated terminal plate 8 has holes 8d through which a pair of lead wires (not shown) led out of a capacitor element pass, and groove portions 8a in which the lead wires bent perpendicularly are placed. And at its corners, plural wall portions 8b and 8c having respective inner surfaces abut and hold the periphery of a metal case. Notches 8e are formed at the outer peripheries of wall portions 8b and 8c. The wall portions 8b and 8c are disposed in pairs having different heights H1 and H2. Predetermining that either one of an anode and cathode of the lead wires are located at either one of the wall portions 8b and 8c having different heights allows the anode and cathode to be identified from an appearance of the mounted capacitor.

The capacitor according to embodiment 3 assures excellent vibration resistance and reliability similarly to embodiment 1.

(Embodiment 4)

Figure 7:
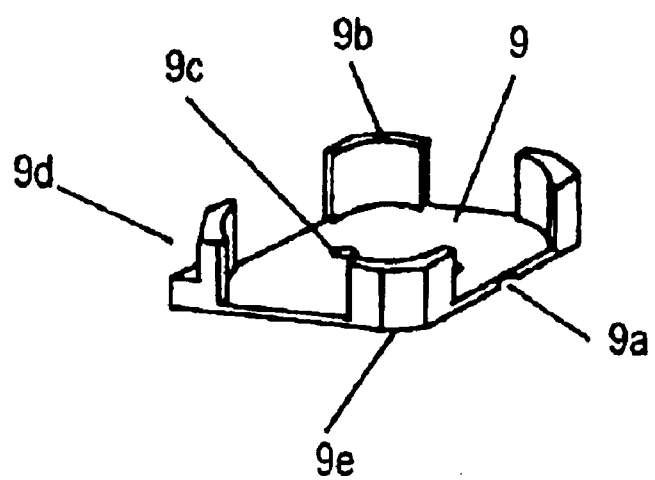
FIG. 7 is a perspective view of an insulated terminal plate of an aluminum electrolytic chip capacitor according to exemplary embodiment 4 of the invention.
Figure 8:
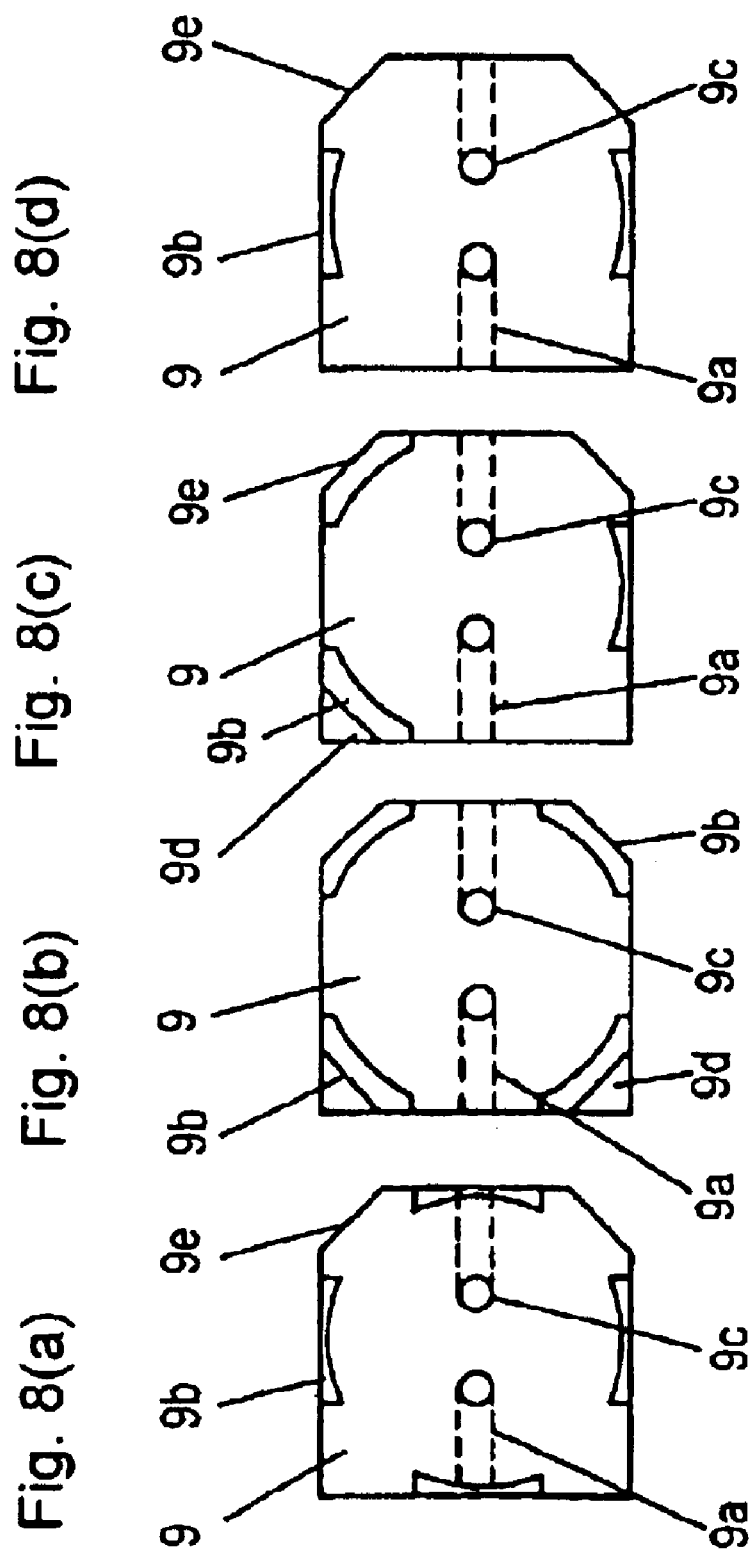
FIGS. 8(*a*) to 8(*d*) are plan views of other insulated terminal plates of the capacitor according to embodiment 4.

FIG. 7 is a perspective view of an insulated terminal plate of a capacitor according to exemplary embodiment 4 of the present invention. FIGS. 8(a) to 8(d) are plan views of other insulated terminal plates. Similarly to embodiment 1, an insulated terminal plate 9 has holes 9c through which a pair of lead wires (not shown) led out of a capacitor element pass, and groove portions 9a in which the lead wires bent perpendicularly are placed. And at its corners, plural wall portions 9b having respective inner surfaces abut and hold the periphery of a metal case. Notch 9d is disposed at outer peripheries of the wall portions 9b. The terminal plate 9 is finished square, and chamfered portions 9e are disposed at two corners at one of the sides crossing a direction of the groove portion 9a. Predetermining that either the anode lead wire or the cathode lead wire is disposed at the side of the chamfered portion 9e allows the anode and cathode to be identified from an appearance of the mounted capacitor.

The wall portions 9b may be positioned at various positions, similarly to embodiment 1. The positions are shown in FIGS. 8(a) to 8(d). Terminal plates 9 shown in FIGS. 8(a) to 8(d) provides the same effect as the terminal plate according to embodiment 1, and the detailed description is omitted.

Combining the terminal plate according to embodiment 4 with the wall portions having different heights according to embodiment 3 enhances the effects of the terminal plate.

(Embodiment 5)

FIG. 9 is a sectional view of an insulated terminal plate of a capacitor according to exemplary embodiment 5 of the present invention. FIGS. 10(a) and 10(b) are perspective views of terminal plates. A metal case 1 of the capacitor is provided with a shrink portion 1a. A lead wire 1b is led out of a capacitor element (not shown) in the case 1. Similarly to embodiment 1, an insulated terminal plate 10 has holes 10c through which lead wires 1b (and 1c, not shown) led out of the capacitor element pass and groove portions 10a in which the lead wires 1b, 1c bent perpendicularly are placed. And at its corners, plural wall portions 10b having respective inner surfaces abut and hold a periphery of the case 1. Notch 10d is disposed at the outer periphery of the wall portion 10b.

The inner surface of wall portion 10b is provided with a projection 10e. FIG. 10(a) shows the projection 10e disposed partially on the inner surface of the wall portion 10b, and FIG. 10(b) shows the projection 10e disposed entirely on the inner surface of the wall portion 10b. The projection 10e fits into the shrink portion 1a of the metal case 1, as shown in FIG. 9, and the wall portion 10b substantially reaches a middle area of the case 1 beyond the projection 1e, thereby holding the case 1. This arrangement provides the capacitor with higher vibration resistance since an area contacting with the case 1 increases. Further, the wall portion 10b securely holds the case 1 against vertical vibrations as well, and thus suppresses the generation of excessive vibrations. The projection 10e is preferably formed unitarily with the wall portion 10b made of resin, or may be made of an elastic material, such as an individual piece of rubber.

(Embodiment 6)

FIGS. 11(a) and 11(b) are perspective views of insulated terminal plates of a capacitor according to exemplary embodiment 6 of the present invention. Similarly to embodiment 1, an insulated terminal plate 11 has holes 11c through which a pair of lead wires (not shown) led out of a capacitor element pass and groove portions 11a in which the lead wires bent perpendicularly are placed. And at its corners, plural wall portions 11b having respective inner surfaces abut and hold the periphery of a metal case.

In embodiment 6, each wall portion 11b is made of elastic metal, and a projection 11d is disposed on the inner surface of the portion 11b. The wall portions 11b which are individually formed are integrally formed when the terminal plate 11 is formed. Or, the wall portion 11b is preferably press-fitted and secured in a recess disposed in the terminal plate 11.

The projection 11d on the inner surface of wall portion 11b is preferably formed after fitting to the terminal plate 11 in the metal case 1.

The above configuration allows the wall portion 11b to hold the metal case 1 more reliably, thus providing higher vibration resistance, and suppressing the generation of excessive vibrations including vertical vibrations.

In embodiment 6, the projection 11d is disposed on the inner surface of the wall portion 11b, but similar effects are obtainable even if the wall portion 11b does not have the projection 11d.

Further, bonding the wall portions to the periphery of the metal case with adhesive allows the capacitor to be held more reliably in each of embodiments 1 to 6.

(Embodiment 7)

Figure 12A:
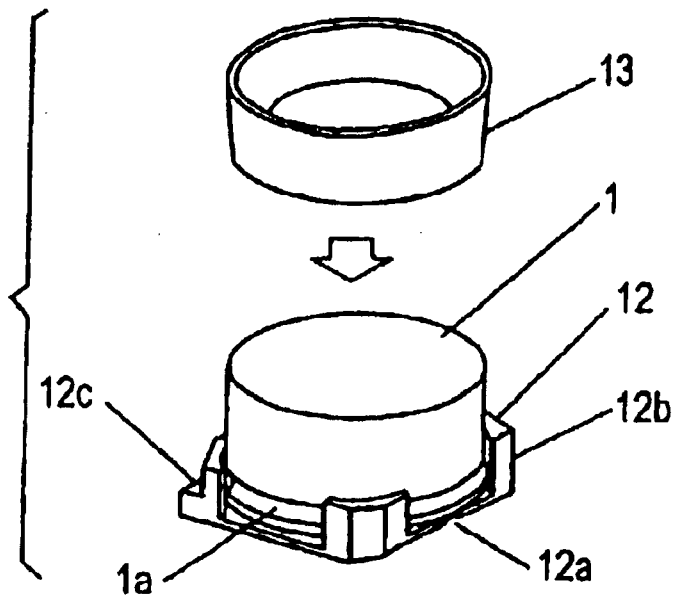
FIGS. 12(*a*) and 12(*b*) are an exploded perspective view and an assembled perspective view of an insulated terminal plate of an aluminum electrolytic chip capacitor according to exemplary embodiment 7 of the invention.
Figure 12B:
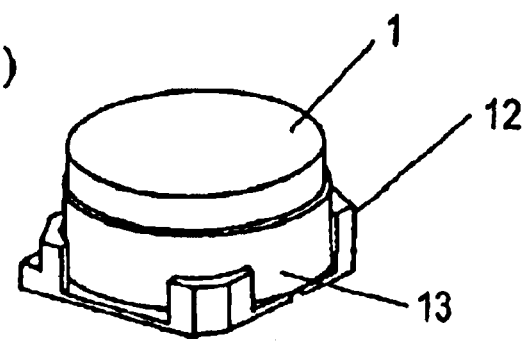

FIGS. 12(a) and 12(b) are an exploded perspective view and an assembled perspective view of a capacitor according to exemplary embodiment 7 of the present invention. A metal case 1 of the capacitor is provided with a shrink portion (reduced-diameter portion) 1a. Similarly to embodiment 1, an insulated terminal plate 12 has a hole (not shown) through which a lead wire led out of a capacitor element passes and a groove portion 12a in which the lead wire bent perpendicularly is placed. And at its corners, plural wall portions 12b having respective inner surfaces abut and hold the periphery of the case 1. Notch 12c is disposed at the outer periphery of the wall portion 12b.

An annular holder 13 is tapered to have its lower end side be smaller than a distance between the inner surfaces of the wall portions 12b opposing each other, and its upper end side be greater than such distance. The taper allows the holder 13 to fit onto the case 1. The holder 13 securely holds the case 1 with entire inner surfaces of the wall portions 12b. This arrangement suppresses the generation of excessive vibrations and provides the capacitor with higher vibration resistance. The holder 13 may be made of resin or metal. The holder 13 may not have the annular shape unitarily formed, but may be a wedge-like piece disposed only at each wall portion 12b.

(Embodiment 8)

Figure 13:
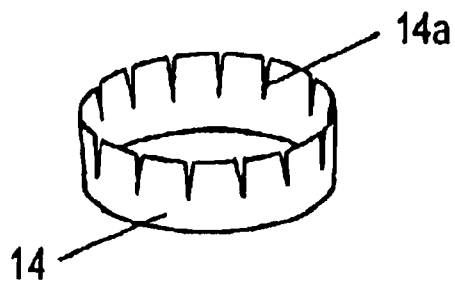
FIG. 13 is a perspective view of a holder of a capacitor according to exemplary embodiment 8 of the invention.

FIG. 13 is a perspective view of a holder of a capacitor according to exemplary embodiment 8 of the present invention. In embodiment 8, the holder is the same as that of embodiment 7 but provided with plural slits at its upper end side. Other than the provision of the slits, embodiment 8 is identical to embodiment 7, and therefore, the description is omitted for the identical portions, and only different portions are described below.

An annular holder 14 is tapered to have its lower end side be smaller than a distance between the inner surfaces of wall portions opposing each other, and its upper end side be greater than such distance. The upper end side is provided with plural slits 14a. Thus, the upper end side provided with the slits 14a widens in a direction of its outer periphery and has a larger diameter. This allows the holder 14 to fit onto a metal case 1. In addition, the upper end side of the holder fitting onto the case is narrowed in a direction of its inner periphery by the wall portions on an insulated terminal plate, and has a smaller diameter. The holder securely holds the periphery of the metal case with its entire inner surface, and thus suppresses the generation of excessive vibrations to ensure high vibration resistance.

(Embodiment 9)

Figure 14:
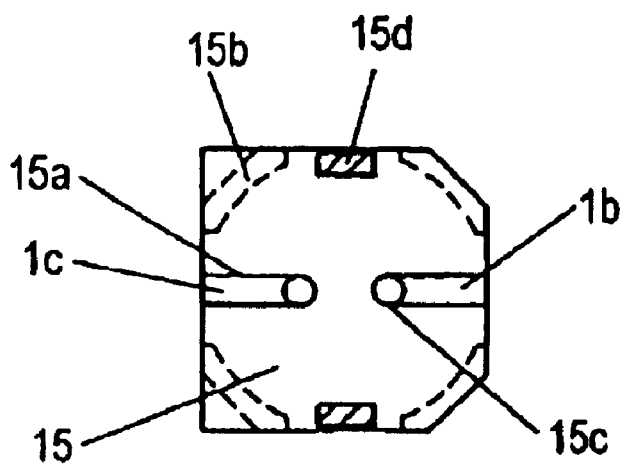
FIG. 14 is a bottom view of an aluminum electrolytic chip capacitor according to exemplary embodiment 9 of the invention.

FIG. 14 is a bottom view of a capacitor according to exemplary embodiment 9 of the present invention. Similarly to embodiment 1, an insulated terminal plate 15 has holes 15c through which a pair of lead wires 1b and 1c led out of a capacitor element pass and groove portions 15a in which the lead wires 1b and 1c bent perpendicularly are placed. At its corners, plural wall portions 15b abut and hold an inner periphery of a metal case 1.

A pair of dummy terminals 15d at the bottom of the terminal plate 15 are located at positions other than on a line in a bending direction of the lead wires 1b and 1c of the periphery of the terminal plate 15. The terminals 15d are soldered when the capacitor is mounted on a board similarly to the lead wires 1b and 1c. This arrangement allows the insulated terminal plate 15 to be mounted on a board, and thus suppresses the generation of excessive vibrations to obtain excellent vibration resistance.

(Embodiment 10)

Capacitors according to some of the embodiments of the present invention and conventional capacitors (φ18×16.5 mmL) as comparative examples were manufactured in lots of five pieces each. The capacitors were mounted on a board for vibration tests, and the results of the tests are shown in Table 1.

(Samples)

(a) A capacitor including an insulated terminal plate having wall portions in a middle of each side of the terminal plate as shown in FIG. 3(a) of embodiment 1;

(b) A capacitor including an insulated terminal plate having wall portions at each corner of the terminal plate as shown in FIG. 3(b) of embodiment 1;

(c) A capacitor including an insulated terminal plate having a metal plate on an outer surface of a groove portion as shown in FIG. 4 of embodiment 2;

(d) A capacitor including an insulated terminal plate having a projection disposed partially on sample (b) as shown in FIG. 10(a) of embodiment 4;

(e) A capacitor including an insulated terminal plate having a projection disposed entirely on sample (b) as shown in FIG. 10(b) of embodiment 4;

(f) A capacitor including an insulated terminal plate having a projection disposed entirely on sample (a);

(g) A capacitor including an insulated terminal plate having wall portions made of elastic metal having projections as shown in FIG. 11(a) of embodiment 5;

(h) A capacitor including an annular holder disposed between a metal case and a wall portion as shown in FIGS. 12(a) and 12(b) of embodiment 6; and (i) A conventional capacitor.

(Test Conditions)

Figure 15:
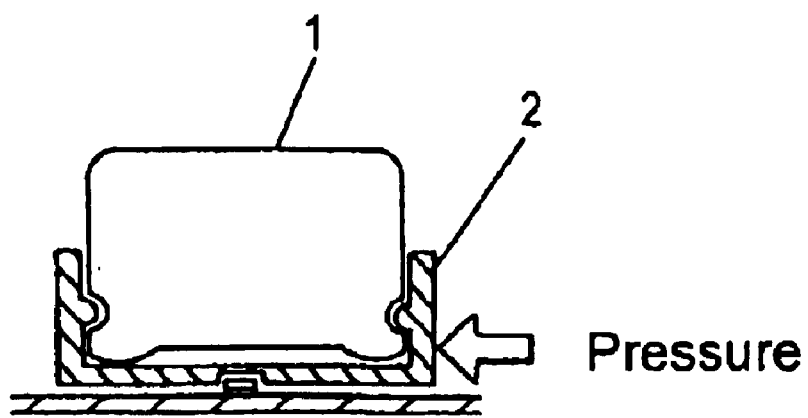
FIG. 15 is a sectional view of an aluminum electrolytic chip capacitor for showing a test method according to exemplary embodiment 10 of the invention.
Figure 16A:
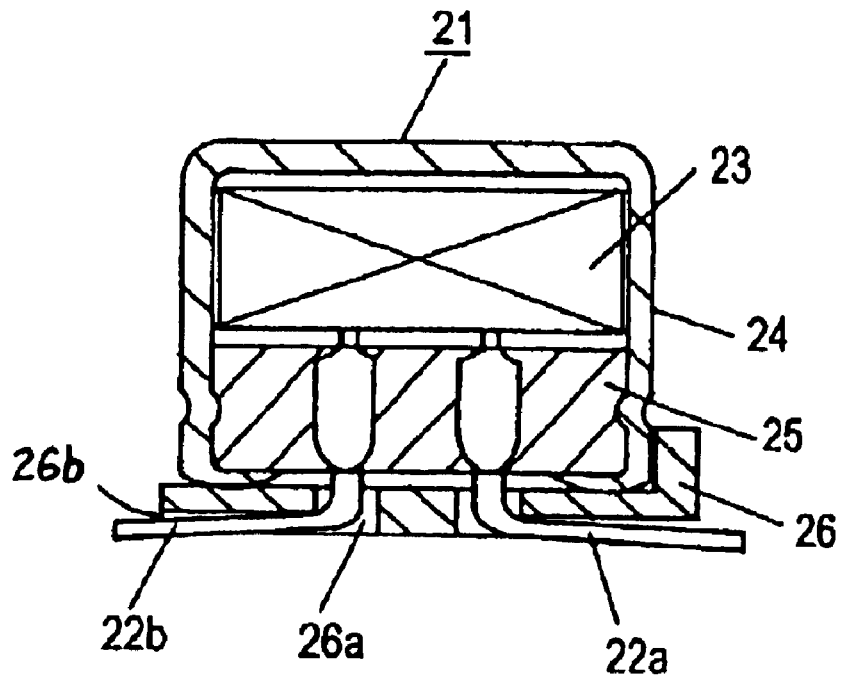
FIG. 16(*a*) is a front sectional view of a conventional aluminum electrolytic chip capacitor.
Figure 16B:
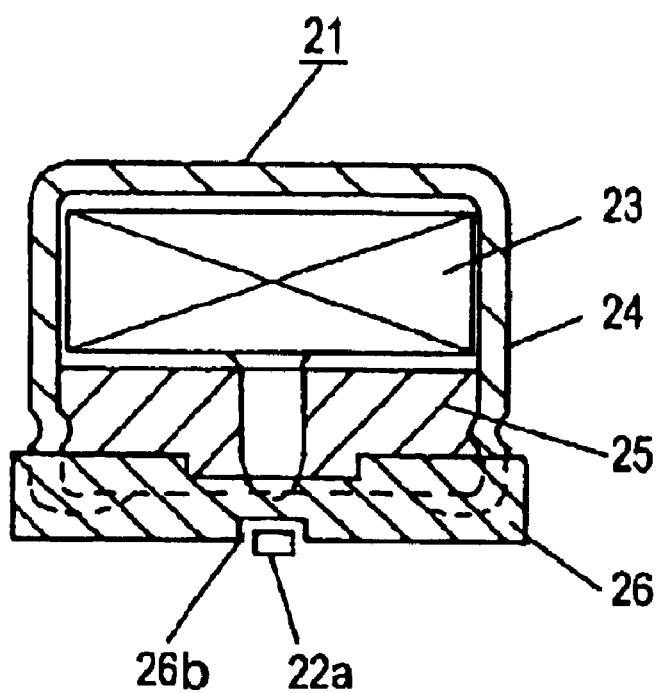
Figure 17:
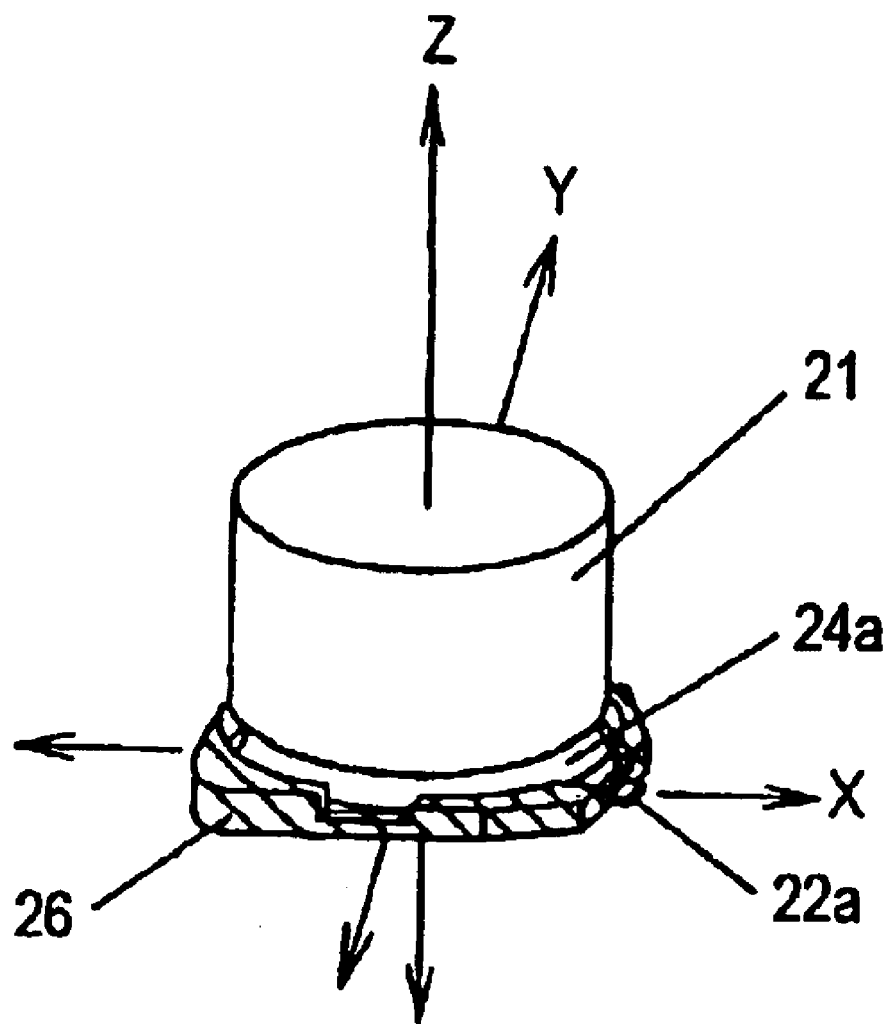
FIG. 17 is a perspective view of an aluminum electrolytic chip capacitor for showing a direction of vibrations given in a vibration test of an aluminum electrolytic chip capacitor.
Figure 18:
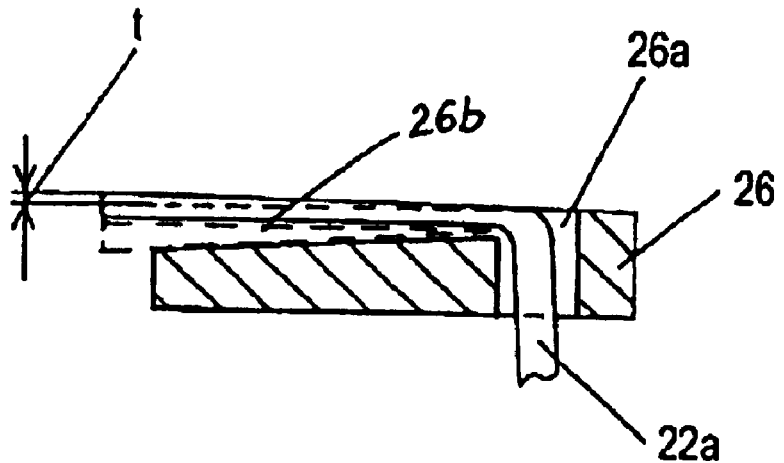
FIG. 18 is a sectional view of an essential portion of the conventional capacitor for showing a lead wire floating.
Figure 19:
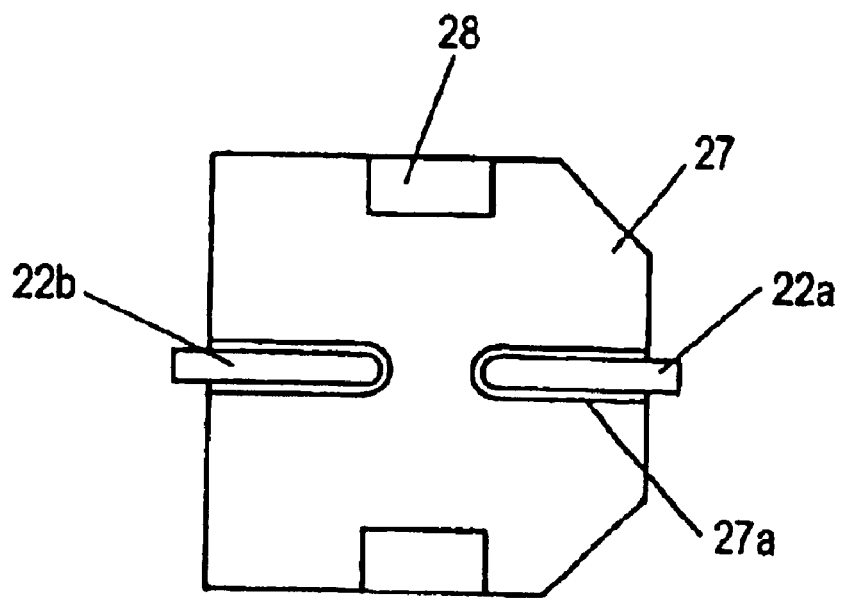
FIG. 19 is a bottom view of a conventional aluminum electrolytic chip capacitor including a dummy terminal.

(1) The number of capacitors having their lead wires broken:
   Direction of Vibrations: X-, Y-, and Z-directions as shown in FIG. 15.
   Amplitude of Vibrations: 7.5 mm
   Acceleration of Vibrations: 30 G
   Frequency of Vibration: 5–1000 Hz
   Time for Vibration: 15 cycles, total 120 min. (8 min. per cycle).

(2) Peak Vibration
   Direction of Vibration: Y-direction shown in FIG. 15.
   Acceleration of Vibration: 1 G
   Frequency of Vibration: 5–1000 Hz
   Time for Vibration: 8 min.

TABLE 1

|  |  | Samples | | | | | | | | |
| --- | --- | --- | --- | --- | --- | --- | --- | --- | --- | --- |
|  |  | (a) | (b) | (c) | (d) | (e) | (f) | (g) | (h) | (i) |
| Number of Capacitors Having Lead Wires Broken | X-direction | 0/5 | 0/5 | 0/5 | 0/5 | 0/5 | 0/5 | 0/5 | 0/5 | 0/5 |
|  | Y-direction | 0/5 | 0/5 | 0/5 | 0/5 | 0/5 | 0/5 | 0/5 | 0/5 | 5/5 |
|  | Z-direction | 0/5 | 0/5 | 0/5 | 0/5 | 0/5 | 0/5 | 0/5 | 0/5 | 0/5 |
| Acceleration of Peak Vibration (G) |  | 2.5 | 2.4 | 2.2 | 2.4 | 2.3 | 2.2 | 2.4 | 2.2 | 5.5 |

As shown in the above Table 1, all the capacitors of the present invention exhibited reliable vibration resistance without breakage of the lead wires. Also, the capacitors of the present invention accepted the peak acceleration less than one half of that on the conventional capacitor.

Further, a dummy terminal 15d shown in FIG. 14 of embodiment 9 was made on samples (a), (b), and (c) for a test of the capacitors, and the results of the test are shown in Table 2.

(Test Conditions)
  (1) Acceleration of Peak Vibration
    Direction of Vibration: Y-direction shown in FIG. 15.
    Acceleration of Vibration: 1 G
    Frequency of Vibration: 5–1000 Hz
    Time for Vibration: 8 min.
  (2) Breaking strength
    As shown in FIG. 15, the insulated terminal plate 2 fitting to the metal case 1 is pressed in a Y-direction. The soldered portion indicates the pressure applied at the breakage.

TABLE 2

|  | Samples | | | | | |
| --- | --- | --- | --- | --- | --- | --- |
|  | (a) | | (b) | | (i) | |
| Dummy Terminal | Yes | No | Yes | No | Yes | No |
| Peak Acceleration (G) | 2.5 | 2.5 | 2.5 | 2.4 | 5.4 | 5.5 |
| Applied Pressure (kg) | 10.2–11.3 | 6.6–7.0 | 9.5–11.8 | 6.4–7.1 | 9.8–11.2 | 6.5–7.1 |

As is apparent in the above Table 2, the dummy terminal 15d does not lower the acceleration of vibration, but however, increases the breaking pressure. The terminal increases its soldering strength, and allows a capacitor to have its soldered portions be hardly broken or peeled due to vibrations.

According to the above embodiments, the technology of the present invention is applied to an aluminum electrolytic chip capacitor, but is not limited to this. It is applicable to an electronic chip component, such as a chip capacitor having a similar shape.

INDUSTRIAL APPLICABILITY

The present invention relates to a chip capacitor, particularly to an aluminum electrolytic chip capacitor to be mounted on a board and required to have excellent vibration resistance.

The capacitor includes an insulated terminal plate having wall portions which abut and hold a metal case. The capacitor ensures excellent vibration resistance even against strong vibrations applied in all directions, and is thus reliable.

The capacitor may include a metal portion made of metal-plated coat or a metal sheet on a surface of a groove portion of the insulated terminal plate. The capacitor allows the metallic portion to be soldered even when lead wires are placed deeply in the groove portions, and as a result, the lead wires are soldered reliably as well.

What is claimed is:

1. A chip capacitor comprising:
  a capacitor element having an anode lead wire and a cathode lead wire connected thereto;
  a cylindrical metal case accommodating said capacitor element, said metal case having a bottom and having an annular reduced-diameter portion formed thereon;
  a sealing member for sealing an open end of said metal case, said sealing member having holes formed therein through which said anode lead wire and said cathode lead wire pass, respectively;
  an insulated terminal plate disposed so as to abut said sealing member, said insulated terminal plate having holes formed therein through which said anode lead wire and said cathode lead wire pass, respectively, and groove portions formed on an outer surface thereof in which said anode lead wire and said cathode lead wire are bent and placed; and
  a plurality of wall portions disposed on a periphery of said insulated terminal plate at respective positions on a line other than a line in a bending direction of said anode and cathode lead wires, said plurality of wall portions abutting a periphery of said metal case, said plurality of wall portions being higher than a height of said reduced-diameter;
  wherein at least one of said plurality of wall portions has a notch formed therein at said periphery.

2. The chip capacitor of claim 1,
  wherein said insulated terminal plate has a square shape, and
  wherein said plurality of wall portions are disposed at corners of said insulated terminal plate, respectively.

3. The chip capacitor of claim 1, further comprising:
  a metal portion disposed on a surface of each said groove portion and on a part of a surface of said insulated terminal plate connecting to said surface of each said groove portion.

4. The chip capacitor of claim 3, wherein said metal portion is made of one of metal-plated coat and a metal sheet.

5. The chip capacitor of claim 1, wherein a wall portion of said plurality of wall portions close to said anode lead wire has a different height than a wall portion of said plurality of wall portions disposed close to said cathode lead wire.

6. The chip capacitor of claim 1, wherein said insulated terminal plate has two corners chamfered, said corners being located on a side of said insulated terminal plate at which one of said anode lead wire and said cathode lead wire is located.

7. The chip capacitor of claim 1, further comprising:
  a pair of dummy terminals disposed on said insulated terminal plate and located on a line other than a line in said bending direction of said lead wires.

8. A chip capacitor comprising:
  a capacitor element having an anode lead wire and a cathode lead wire connected thereto;
  a cylindrical metal case accommodating said capacitor element, said metal case having a bottom and having an annular reduced-diameter portion formed thereon;
  a sealing member for sealing an open end of said metal case, said sealing member having holes formed therein through which said anode lead wire and said cathode lead wire pass, respectively;
  an insulated terminal plate disposed so as to abut said sealing member, said insulated terminal plate having holes formed therein through which said anode lead wire and said cathode lead wire pass, respectively, and groove portions formed on an outer surface thereof in which said anode lead wire and said cathode lead wire are bent and placed;
  a plurality of wall portions disposed on a periphery of said insulated terminal plate at respective positions on a line other than a line in a bending direction of said anode and cathode lead wires, said plurality of wall portions abutting a periphery of said metal case, said plurality of wall portions being higher than a height of said reduced-diameter; and a metal portion disposed on a surface of each said groove portion and on a part of a surface of said insulated terminal plate connecting to said surface of each said groove portion.

9. The chip capacitor of claim 8, wherein said metal portion is made of one of metal-plated coat and a metal sheet.

10. A chip capacitor comprising:

a capacitor element having an anode lead wire and a cathode lead wire connected thereto;

a cylindrical metal case accommodating said capacitor element, said metal case having a bottom and having an annular reduced-diameter portion formed thereon;

a sealing member for sealing an open end of said metal case, said sealing member having holes formed therein through which said anode lead wire and said cathode lead wire pass, respectively;

an insulated terminal plate disposed so as to abut said sealing member, said insulated terminal plate having holes formed therein through which said anode lead wire and said cathode lead wire pass, respectively, and groove portions formed on an outer surface thereof in which said anode lead wire and said cathode lead wire are bent and placed; and a plurality of wall portions disposed on a periphery of said insulated terminal plate at respective positions on a line other than a line in a bending direction of said anode and cathode lead wires, said plurality of wall portions abutting a periphery of said metal case, said plurality of wall portions being higher than a height of said reduced-diameter;

wherein a wall portion of said plurality of wall portions close to said anode lead wire has a different height than a wall portion of said plurality of wall portions disposed close to said cathode lead wire.

* * * * *